(12) United States Patent
Maruo

(10) Patent No.: US 8,513,627 B2
(45) Date of Patent: Aug. 20, 2013

(54) CHARGED PARTICLE BEAM APPARATUS

(75) Inventor: Masayuki Maruo, Chiba (JP)

(73) Assignee: SII NanoTechnology Inc. (JP)

( * ) Notice: Subject to any disclaimer, the term of this patent is extended or adjusted under 35 U.S.C. 154(b) by 285 days.

(21) Appl. No.: 12/378,186

(22) Filed: Feb. 11, 2009

(65) Prior Publication Data

US 2009/0212239 A1 Aug. 27, 2009

(30) Foreign Application Priority Data

Feb. 16, 2008 (JP) .................. 2008-035380

(51) Int. Cl.
*G21K 7/00* (2006.01)
(52) U.S. Cl.
USPC ............ 250/492.3; 250/441.11; 250/306; 250/310; 250/440.11; 250/492.2
(58) Field of Classification Search
USPC ............ 250/492.21, 309, 441.11, 443.1
See application file for complete search history.

(56) References Cited

U.S. PATENT DOCUMENTS

| 6,365,905 B1 * | 4/2002 | Koyama et al. .......... 250/492.21 |
| 6,658,084 B2 * | 12/2003 | Singer ............................. 378/34 |
| 7,196,841 B2 * | 3/2007 | Melzer et al. ................. 359/351 |
| 2003/0086524 A1 * | 5/2003 | Schultz et al. ................. 378/34 |
| 2005/0174650 A1 * | 8/2005 | Melzer et al. ................. 359/627 |

FOREIGN PATENT DOCUMENTS

JP 3921347 5/2007

* cited by examiner

*Primary Examiner* — Nikita Wells
*Assistant Examiner* — Johnnie L Smith
(74) *Attorney, Agent, or Firm* — Adams & Wilks

(57) ABSTRACT

An assist gas having a very small amount and a uniform concentration is fed by a charged particle beam apparatus, in which a supply amount of gas is intermittently fed by a massflow controller, and gas is passed through a diffusion mechanism connected to the massflow controller, whereby an assist gas having a very small amount and a uniform concentration.

20 Claims, 2 Drawing Sheets

CHARGED PARTICLE BEAM APPARATUS

BACKGROUND OF THE INVENTION

The present invention relates to a charged particle beam apparatus such as a scanning electron microscope and a scanning ion microscope, particularly to a charged particle beam apparatus using an assist gas including an etching gas.

DESCRIPTION OF THE RELATED ART

In a scanning charged particle microscope apparatus such as a scanning electron microscope and a scanning ion microscope, an assist gas is sometimes used to deposit a thin film onto a sample, or to control an etching rate. In addition, it is known that by the action of gas, electrical charges on the sample surface are sometimes neutralized. Because the supply amount of an assist gas to the sample surface affects its action, the amount is controlled in various methods.

The invention described in Patent Reference 1 adopts a method that controls a valve provided on the front of a gas nozzle for intermittent gas supply (see Japanese Patent No. 3921347). In this invention, the gas concentration is intermittently changed on the sample surface, whereby the invention intends to prevent the resolution of a scanning charged particle microscope from being degraded because of excessive gas.

SUMMARY OF THE INVENTION

In the charged particle beam apparatus such as a scanning electron microscope and a scanning ion microscope, in feeding an assist gas onto the sample surface, for example, a gas supply amount adjusting device such as a massflow controller is used to adjust a supply amount. At this time, when the action of gas is strong, or when it is expected to effect the action by a very small amount of gas, it is necessary to reduce the supply amount.

However, available massflow controllers have limitations in the minimum amount adjustable to regulate the supply amount. For example, a commercially available massflow controller is a device that regulates a flow rate of gas of 10 ml/min at the maximum. However, this massflow controller is unable to set such values that the minimum amount is 0.2 ml/min or below. When these values of the supply amount or below are specified, gas supply is stopped.

In addition, in the invention described in Patent Reference 1, although gas can be rarefied, it is unable to feed gas of uniform concentration because the valve provided on the front of the gas nozzle is controlled.

An object of the invention is to solve the problem, and to provide a charged particle beam apparatus that feeds a very small amount of gas equal to or below the minimum amount of a gas supply amount adjusting device such as a massflow controller to the vicinity of a position at which a charged particle beam is irradiated.

In order to solve the problem, in a charged particle beam apparatus according to the invention, first, the flow rate setting of a gas supply amount adjusting device such as a massflow controller is intermittently controlled, whereby such an average gas supply amount is implemented that the amount is equal to or below the minimum supply amount of the gas supply amount adjusting device. Secondly, the gas flow intermittently controlled is introduced into a diffusion mechanism to reduce variations in gas concentration, whereby a gas of more uniform concentration is fed.

The gas flow is intermittently fed from the gas supply amount adjusting device such as a massflow controller having a flow rate setting intermittently controlled, and the gas flow is uniformized by diffusion conducted by the diffusion mechanism, whereby a very small amount of gas with no variations in the flow rate can be fed near the position on the sample surface at which a charged particle beam is irradiated.

DESCRIPTION OF THE PREFERRED EMBODIMENT

Figure 1:
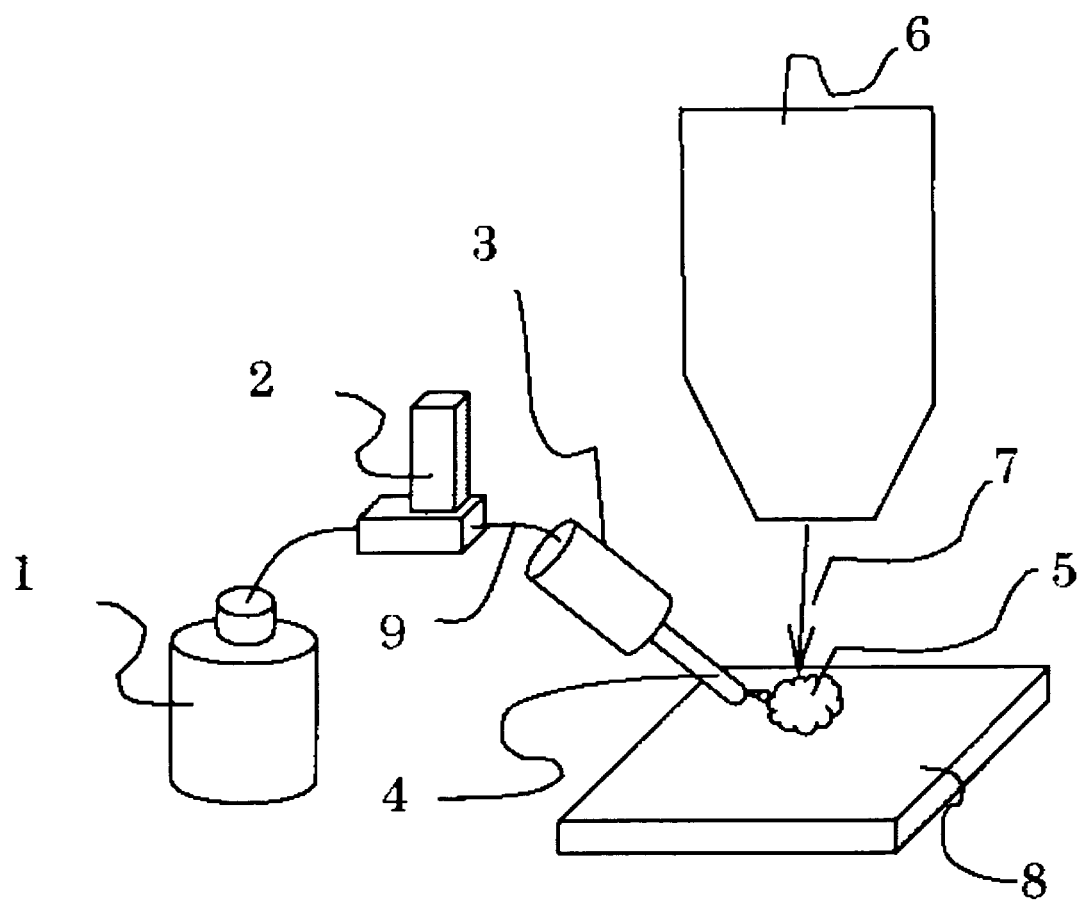
FIG. 1 shows an embodiment of a charged particle beam apparatus according to the invention.

FIG. 1 shows a charged particle beam apparatus according to an embodiment of the invention.

The flow rate of gas stored in a gas reservoir 1 is controlled by a massflow controller (control device) 2 that is a gas supply amount adjusting device, and uniformized by a gas diffusion mechanism 3, and a supply gas 5 is fed from a gas nozzle 4 onto a sample 8. Here, the gas to be fed may be an etching assist gas used to cause chemical changes in the irradiation surface by the reaction of gas with a charged particle beam to generate structural changes at that location, a gas used for deposition, or a gas used to neutralize electrical charges on the sample surface.

An ion beam 7 that is irradiated from an FIB (focused ion beam) lens barrel 6 reaches the sample 8 together with the supply gas 5, and acts on the sample surface. In this embodiment, the gas diffusion mechanism 3 is implemented by thickening a part of a pipe that forms a gas flow path so that it is thicker than the other parts. In other words, the gas diffusion mechanism 3 is formed of a gas pipe arrangement 9 made of gas pipes configured to form the gas flow path between the gas diffusion mechanism 3 and the massflow controller 2 and having a pipe or pipe section having a diameter larger than that of the gas nozzle 4. In addition, intermittent control over the gas flow is implemented by intermittent application of the voltage of flow rate regulation control signals for the massflow controller 2. Control over the massflow controller 2 is conducted according to analog voltage. This analog voltage is switched between zero and a specified value. More specifically, data of a control digital-to-analog converter is changed periodically.

In this gas supply device, for example, such intermittent control is conducted in repeated cycles in which a gas flow of 0.2 ml/min, which is the minimum supply amount of the massflow controller 2, is fed for 0.1 second and is stopped for 0.9 second, and then a gas supply amount of 0.02 ml/min can be implemented.

Figure 2:
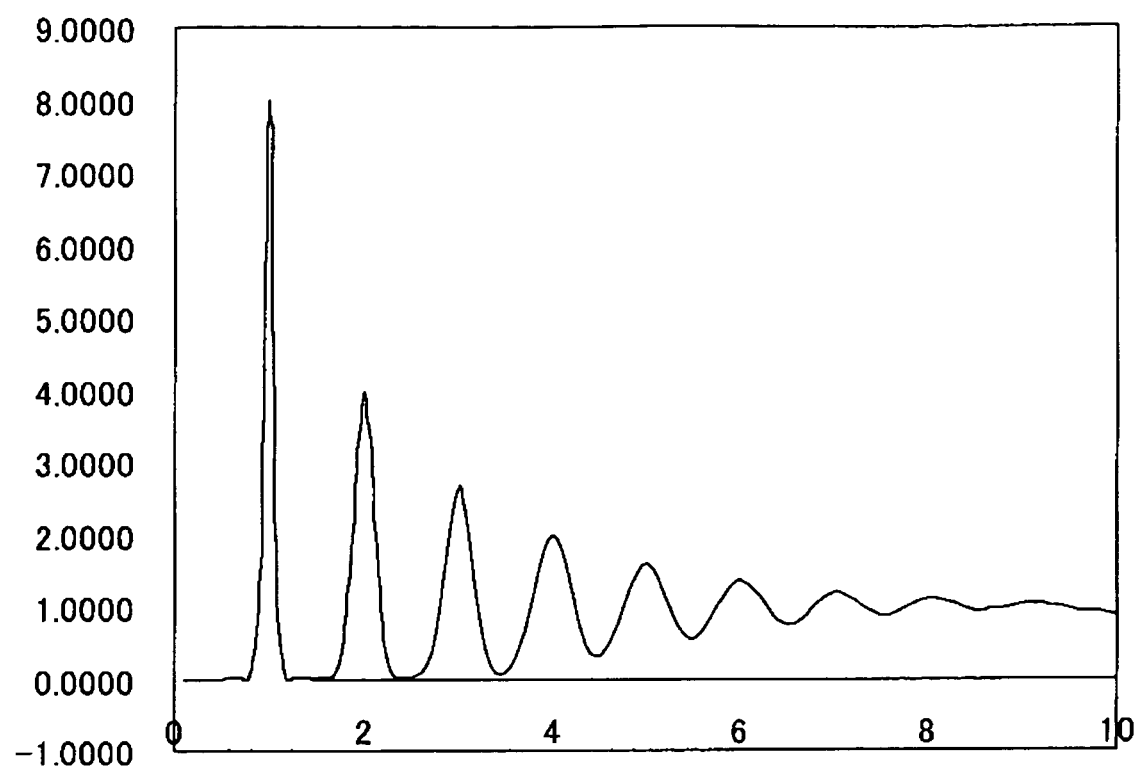
FIG. 2 shows a conceptual diagram depicting gas diffusion by a gas diffusion mechanism according to the invention.

FIG. 2 shows a conceptual diagram depicting a manner that gas from the gas supply device according to the invention is uniformized while the gas is passing through the diffusion mechanism. The vertical axis shown in FIG. 2 indicates the gas concentration at a certain moment. The horizontal axis indicates the position of the diffusion mechanism; the left side is gas input, and the right side is gas output. Gas intermittently fed from the left side flows through the diffusion mechanism for output from the right side. Because gas is diffused when it has the concentration gradient, as apparent from FIG. 2, the gas is diffused rightward and leftward while the concentration is lowered as the gas flows. Because the gas is intermittently fed, the gas first flows through the diffusion mechanism as a block of gas. Then, this block of gas is gradually mixed with the blocks of gas before and after the block, and finally outputted as a gas flow of a constant concentration.

The length of the diffusion mechanism is determined according to the flow rate of gas and the intermittent cycle of gas supply. In the example shown in FIG. 2, when the length is set to the distance or longer through which gas flows for the time period about ten times the intermittent cycle of gas, an almost uniform gas flow is obtained.

In addition, when the diffusion mechanism is provided with a diameter larger than that of the other gas flow paths, expansion and compression occur in the gas flow at the inlet and the outlet of the diffusion mechanism, which makes gas concentration more uniform.

In addition, when the concentration of the gas flow is made higher than that achievable by intermittent control, it is sufficient that intermittent control is not conducted and the control voltage of the massflow controller 2 is set to a constant value that can achieve a desired concentration.

In the embodiment, an example of the focused ion beam apparatus is taken as the charged particle beam apparatus. However, the invention is also applicable to scanning electron microscopes.

According to the invention, such a charged particle beam apparatus can be implemented that the apparatus can obtain a very small gas supply amount equal to or below the minimum amount of a gas supply amount adjusting device such as a massflow controller.

What is claimed is:

1. A charge particle beam apparatus comprising:
   a charged particle beam lens barrel configured to irradiate a charged particle beam;
   a gas nozzle configured to feed gas near a position on a sample at which the charged particle beam is irradiated; and
   a gas supply amount adjusting device configured to be periodically operated to control a flow rate of gas between a gas supply source and the gas nozzle to intermittently feed the gas to the gas nozzle side.

2. The charged particle beam apparatus according to claim 1, comprising a gas diffusion mechanism provided between the gas nozzle and the gas supply amount adjusting device,
   wherein a diameter of the gas diffusion mechanism is larger than diameters of a gas pipe arrangement connected to the gas supply amount adjusting device and the gas nozzle.

3. The charged particle beam apparatus according to claim 1, wherein a chemical change is caused on an irradiation surface by a reaction of gas with a charged particle beam, and a structural change is generated at that location.

4. The charged particle beam apparatus according to claim 1, wherein an electrical charge on a charged particle beam irradiation surface is neutralized by gas.

5. The charged particle beam apparatus according to claim 1, wherein the charged particle beam is an ion beam.

6. The charged particle beam apparatus according to claim 1, wherein the charged particle beam is an electron beam.

7. A charged particle beam apparatus comprising:
   a charged particle beam lens barrel that irradiates a charged particle beam onto a sample;
   a gas nozzle that feeds gas toward a region of the sample irradiated by the charge particle beam;
   a control device configured to control the flow rate of gas fed from a gas supply source by intermittently flowing the gas along a flow path to the gas nozzle; and
   a gas diffusion mechanism disposed in the flow path between the gas nozzle and the control device for diffusing and uniformizing the intermittent gas flow before it reaches the gas nozzle.

8. A charged particle beam apparatus according to claim 7; wherein the control device is configured to intermittently feed the gas in repeated cycles in which, in each cycle, the time during which gas is fed to the gas diffusion mechanism is less than the time during which gas is not fed from the diffusion mechanism.

9. A charged particle beam apparatus according to claim 7; including gas pipes connecting the gas nozzle to the gas diffusion mechanism and connecting the gas diffusion mechanism to the control device, the gas diffusion mechanism having a larger diameter than that of the gas pipes.

10. A charged particle beam apparatus according to claim 7; wherein the length of the gas diffusion mechanism is at least ten times longer than the distance through which the gas flows in one cycle.

11. A charged particle beam apparatus according to claim 7; wherein the charged particle beam is an ion beam.

12. A charged particle beam apparatus according to claim 7; wherein the charged particle beam is an electron beam.

13. A charged particle beam apparatus according to claim 1; wherein the gas supply amount adjusting device is periodically operated to obtain a gas flow rate on the order of 0.02 ml/min.

14. A charged particle beam apparatus according to claim 1; wherein the gas supply amount adjusting device has a minimum gas supply amount when operating continuously and is periodically operated to obtain a gas supply amount as small as one-tenth the minimum gas supply amount.

15. A charged particle beam apparatus according to claim 1; wherein the periodic operation of the gas supply amount adjusting device comprises ON/OFF cycles of operation in which the OFF period is multiple times longer than the ON period.

16. A charged particle beam apparatus according to claim 8; wherein in each cycle, the time during which gas is not fed is multiple times longer than the time during which gas is fed.

17. A charged particle beam apparatus according to claim 7; wherein the control device has a minimum flow rate when operating continuously and is configured to operate periodically to reduce the flow rate to a value below the minimum flow rate.

18. A charged particle beam apparatus according to claim 17; wherein the control device is configured to operate periodically to obtain a flow rate as low as 0.02 ml/min.

19. A charged particle beam apparatus comprising:
   a charged particle beam lens barrel that irradiates a charged particle beam onto a sample;
   a gas nozzle that feeds gas toward a region of the sample irradiated by the charged particle beam;
   control means for controlling the flow rate of gas fed from a gas supply source by intermittently flowing the gas along a flow path to the gas nozzle; and
   a gas diffusion mechanism disposed in the flow path between the gas nozzle and the control device for diffusing and uniformizing the intermittent gas flow before it reaches the gas nozzle.

20. A charged particle beam apparatus according to claim 19; wherein the control means is configured to intermittently feed the gas in repeated cycles in which, in each cycle, the time during which gas is fed to the gas diffusion mechanism is less than the time during which gas is not fed from the gas diffusion mechanism.

* * * * *